United States Patent [19]

Schwefel

[11] 4,412,206

[45] Oct. 25, 1983

[54] DIGITAL ELECTRICAL LENGTH OR ANGLE MEASURING DEVICE

[75] Inventor: Ernst Schwefel, Traunreut, Fed. Rep. of Germany

[73] Assignee: Johannes Heidenhain GmbH, Traunreut, Fed. Rep. of Germany

[21] Appl. No.: 188,276

[22] Filed: Sep. 18, 1980

[30] Foreign Application Priority Data

Sep. 21, 1979 [DE] Fed. Rep. of Germany ....... 2938318

[51] Int. Cl.³ .............................................. H03K 13/18
[52] U.S. Cl. .......................... 340/347 P; 250/231 SE; 340/347 M; 340/347 CC; 371/51
[58] Field of Search ...................... 340/347 M, 347 P; 250/231 SE, 237 B; 371/51

[56] References Cited

U.S. PATENT DOCUMENTS 4,146,873 3/1979 Yamanaka et al. .................. 371/51

Primary Examiner—T. J. Sloyan
Attorney, Agent, or Firm—Max Fogiel

[57] ABSTRACT

A digital electrical length or angle-measuring device connects digitalized scanning signals of at least one coarser revolution code group to first addressing inputs of one or more fixed value stores containing binary-stored calculated variants of the digitalized signals in form of tables, and the variants are alternately connected to outputs of the store in dependence upon the logical condition of the control signal which is derived from the respective higher resolution code groups and which is connected to a second addressing input of the store.

7 Claims, 3 Drawing Figures

DIGITAL ELECTRICAL LENGTH OR ANGLE MEASURING DEVICE

BACKGROUND OF THE INVENTION

This invention relates to a measuring device, and more particularly to an electrical measuring device.

Still more particularly, the invention relates to a digital electrical measuring device. Specifically, the invention relates to a digital electrical length or angle measuring device, particularly an absolute coded length or angle measuring device.

Precision measuring devices are known for measuring geometric values, for example lengths or angles, or values which are derived therefrom such as speed, acceleration, or the like. Such precision measuring devices are used, inter alia, in machine tools, in controls, in testing and measuring apparatuses, in automated manufacturing facilities and in industrial robots.

Length measuring devices are known in various types of constructions and functions. German Published Application No. 2,744,699 contains a review of the various position measuring devices which are known in the art. This published applicatin also discloses a dual scanning method which serves for establishing an absolute connection between two measuring systems of differential resolution, such as a fine measuring system and a coarse measuring system.

Another dual scanning method for coupling two position measuring systems is discussed in an article by H. Walcher in "Archiv fuer technisches Messen und industrieller Messtechnik, ATM", August, 1971, pages R89-R104, revision 427.

In the case of measuring systems of higher resolution and in the case of the coupling of two measuring systems of different resolution the space requirements and the technical requirements increase strongly due to the dual scanning method, since the electronic circuitry for handling the measured results also increases substantially. The requirements for tracers, scanners and electronic circuitry is further increased when it is additionally necessary to provide test bits. Such testing circuits are known from German Allowed Application No. 2,748,320 and from German Published Application No. 2,825,038.

SUMMARY OF THE INVENTION

It is an object of the present invention to overcome the disadvantages of the prior art.

A more particular object of the invention is to provide an improved digital electrical length or angle measuring device which avoids the disadvantages of the known connecting method.

A concomitant object is to provide such a device which is of simple construction and not susceptible to malfunctions.

Still a further object of the invention is to provide a measuring device of the type under discussion which avoids the problems of the prior art, has the advantages outlined above and, nevertheless, assures an absolute connection of the code values.

In keeping with these objects, and with still others which will become apparent hereafter, one feature of the invention resides in a digital electrical length or angle measuring device, particularly an absolute coded length or angle measuring device with means for scanning at least one value representation with code groups of different resolutions and with means for adding higher resolution code groups to coarser resolution code groups. In such a device the invention provides an improvement comprising means for connecting digitalized scanning signals of at least one coarser resolution code group to first addressing inputs of at least one fixed value store containing binary-stored calculated variants of such digitalized signals in form of tables, and means for alternately connecting such variants of the digitalized signals to outputs of the store in dependence upon the logical condition of a control signal which is derived from the respective higher resolution code group and which is connected to a second addressing input of the store.

The invention will hereafter be described with reference to an exemplary embodiment as illustrated in the drawing. It is to be understood, however, that this is only for purposes of explanation and is not intended to be limiting in any way.

DESCRIPTION OF PREFERRED EMBODIMENTS

Figure 1:
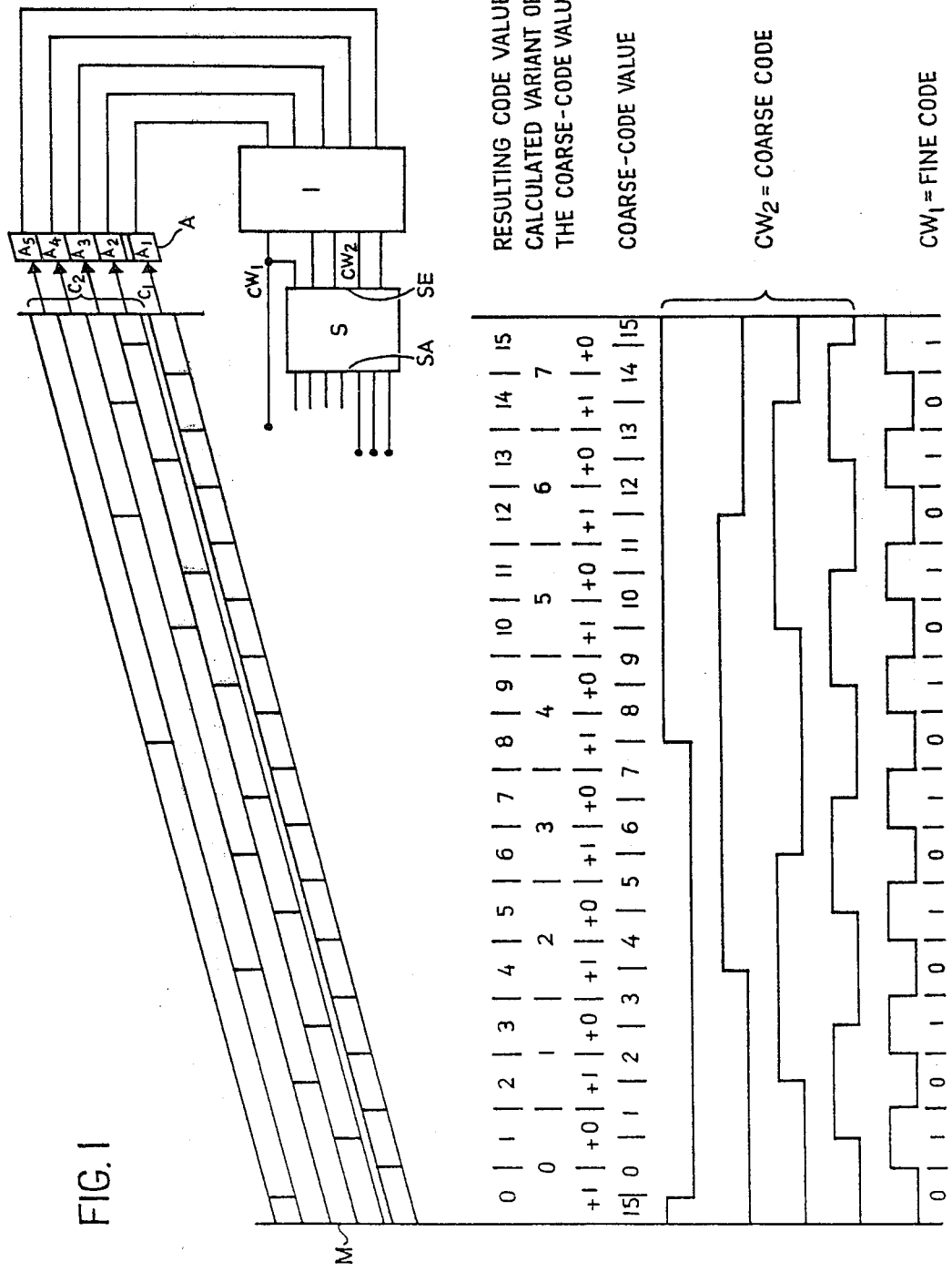
FIG. 1 illustrates a value representation with code traces of different resolution and a signal diagram.

FIG. 1 shows a value representation M with a repetitive one-step fine code (gray code, 1-bit) and a trailing 4-bit coarse code (natural gray code). A not illustrated reading line extends in known manner transverse to the code traces. A scanning element A, which is here illustrated next to the value representation M, is provided for each code trace with light sensitive elements $A_1$-$A_5$.

The scanning signals are amplified in pulse forming stages I (one shown) and triggered (digitalized). A fixed value store S has addressing inputs SE to which the digitalized signals are supplied as code values CW. This fixed value store S, which may be an ROM, PROM, PLA, or the like, stores calculated variants of the code values CW in form of tables. The calculated variation of the code values serves to produce preceding or non-preceding signals.

As mentioned earlier hereinbefore, in the prior art this recognition is made possible by dual scanning. According to the invention, however, the coarse code value is increased by 1 in the first half of the period of a fine measuring system and thereafter is divided by 2, and in the second half of the period of the fine measuring system the coarse code value continues to be divided by 2 (without any rounding off). If the code groups to be connected are to be used not in double but in multiple resolution, then naturally the value to be added and the divisor must be correspondingly changed. The calculated variants of the coarse code are first stored in table form in the aforementioned fixed value store which may be of any of the types outlined above, but which may also be of a different type so long as it is suitable for the intended purpose.

The fixed value store S has the aforementioned addressing inputs SE and also has outputs SA. Depending upon the position of the scanning elements $A_1$-$A_5$ a certain code value $CW_2$ is applied to the addressing input SE of the store S. A further addressing input SE is connected with a higher resolution code group $C_1$ (fine measuring system) which during scanning periodically produces at least one signal serving as the control signal for the store contents. The logical condition—logical 0 for advance signal $\triangleq (CW+1)/2$ and logical 1 for non-preceding signals $\triangleq CW/2$—is determinative for the alternate connection of the respective store contents to the outputs SA of the fixed value store S.

It will be understood that it is possible within the context of the invention to couple more than a single fine measuring system and a single coarse measuring system and to synchronize their measured values.

Figure 2:
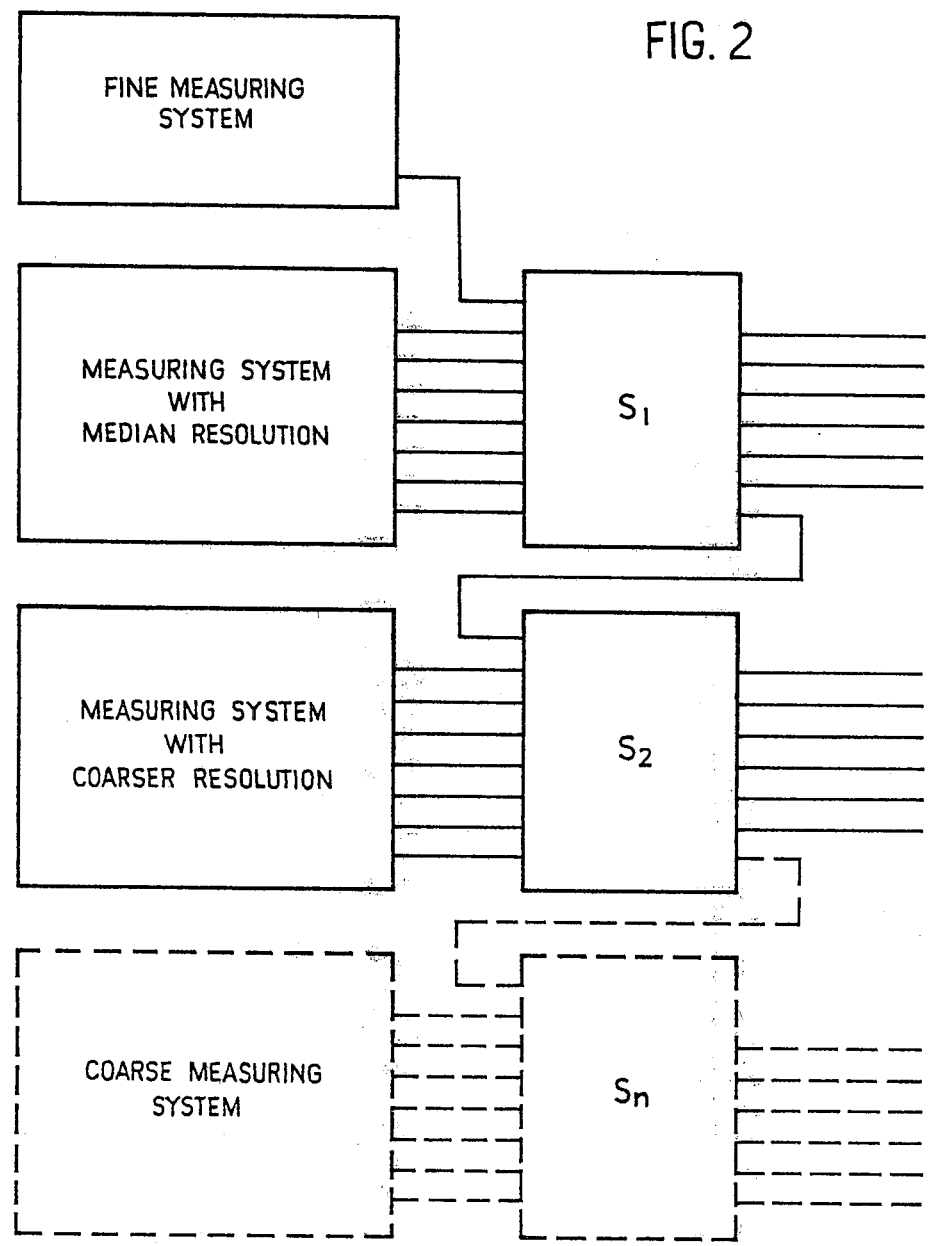
FIG. 2 is a block diagram showing the connection of measuring systems of differential resolution, of absolute and/or incremental construction type.

FIG. 2 is a block diagram which illustrates the linking of measuring systems of different resolution. The synchronization is supplied by the code which has been processed in the fixed value store S, preferably by an additional stored bit that is also stored in the table, with an additional output of each fixed value store $S_1-S_n$ always supplying the control signals for the next coarser code.

It is advantageous in terms of guarding against errors to associate parity tracks with the coarse code groups which are double checked in known manner together with the finer code track.

Figure 3:
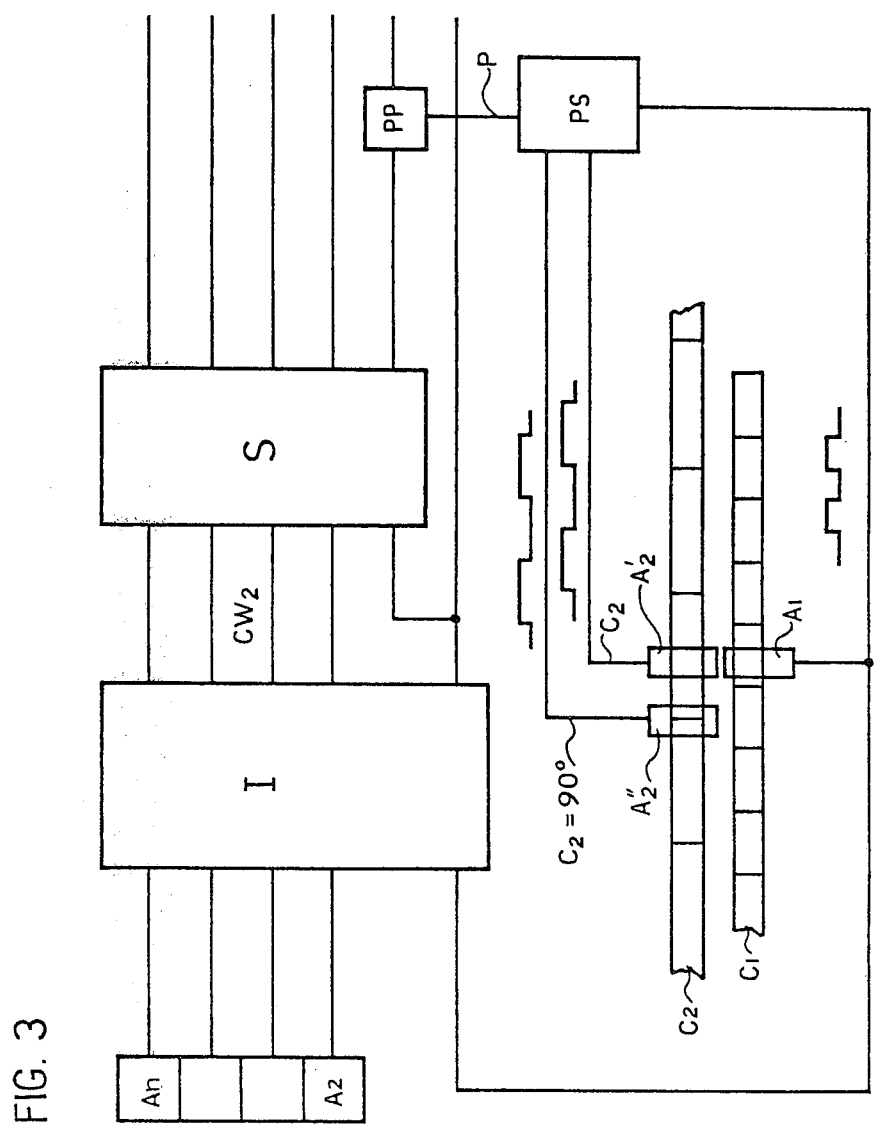
FIG. 3 is a diagrammatic illustration of a parity testing device.

FIG. 3, finally, illlustrates diagrammatically a checking device for checking for the parity tracks. A spatially offset scanner $A''_2$ produces signals which are phase shifted by 90° with reference to the signals which are produced by the scanner $A'_2$. After their digitalization the signals are fed into a parity checking control PS which is controlled by digitalized pulses of the fine code $C_1$. In the control PS a parity signal P is produced which is compared with the output signals of the fixed value store S in a parity testing circuit PP.

Further advantages are obtained if the finest code track is constructed as a 1:1 grid track. A further subdivision can be produced via known resistance networks and 0° and 90° scanning, all of which is known.

The measured values obtained with a position measuring device according to the present invention may be utilized in a position indicator as well as in a numerical control (e.g. for a machine tool or the like) or in a similar device.

It will be appreciated that the invention is not limited to light scanning, but that it is also possible to analogously use other scanning methods, such as electrical scanning, magnetic scanning, mechanical and still other scanning as long as the code tracks are appropriately constructed to permit this. Also, the invention is not limited to absolute measuring systems, because it is analogously usable also in connection with incremental measuring systems.

The invention is, as already suggested above, capable of various modifications all of which are intended to be encompassed within the scope of the appended claims.

What is claimed is:

1. Digital electrical measuring device, particularly an absolute measuring device with means for scanning at least one value representation with code groups of different resolutions and with means for adding unambiguously higher resolution code groups to coarser resolution code groups, wherein the improvement comprises means for connecting digitalized scanning signals (code values CW) of at least one coarser resolution code group ($C_2-C_n$) to first addressing inputs (SE) of at least one fixed value storage (S) containing integral, non-rounded off, binary-stored calculated variants of such digitalized signals (CW) in tabular form; and means for alternately connecting such variants of the digitalized signals (CW) to outputs (SA) of said storage (S), in dependence upon the logical state of a control signal which is derived from the respective higher resolution code groups ($C_1$) and which is connected to a second addressing input (SE) of said storage (S), said variants including $(CW+1)/2$ for preceding signals and $(CW+0)/2=CW/2$ for non-preceding signals when the resolution of a higher resolution code group is double the resolution of a coarser resolution code group so that the calculated variants are dependent on a function of the resolution of the code groups, whereby a resolution of N-2 bits is achieved when a coarse resolution code is interconnected with an intermediate resolution code and a fine resolution code.

2. Digital measuring device as defined in claim 1, wherein one-step codes are used.

3. Digital measuring device as defined in claim 1, wherein said measuring device comprises a length measuring device.

4. Digital measuring device as defined in claim 1, wherein said measuring device comprises an angle measuring device.

5. Digital measuring device as defined in claim 2, wherein a parity signal is derived from at least one of the coarser resolution digitalized signals ($C_2-C_n$) by double scanning at least one trace and is synchronized by a fine resolution digitalized signal ($C_1$).

6. Digital measuring device as defined in claim 5, wherein said fine resolution digitalized signal ($C_1$) has a 1:1 grid track and two scanning signals are produced which are phase shifted relative to one another by 90°, a further subdivision being effected by forming of linear combinations.

7. Digital measuring device as defined in claim 6, and further comprising resistance network means operative for forming said linear combinations.

* * * * *